United States Patent
Yu et al.

(10) Patent No.: US 9,911,892 B2
(45) Date of Patent: Mar. 6, 2018

(54) METHOD FOR THE LOW-TEMPERATURE PRODUCTION OF RADIAL-JUNCTION SEMICONDUCTOR NANOSTRUCTURES, RADIAL JUNCTION DEVICE, AND SOLAR CELL INCLUDING RADIAL-JUNCTION NANOSTRUCTURES

(71) Applicants: Linwei Yu, Palaiseau (FR); Pere Roca I Cabarrocas, Villebon sur Yvette (FR)

(72) Inventors: Linwei Yu, Palaiseau (FR); Pere Roca I Cabarrocas, Villebon sur Yvette (FR)

(73) Assignees: TOTAL S.A., Courbevoie (FR); CENTRE NATIONAL DE LA RECHERCHE SCIENTIFIQUE, Paris (FR); ECOLE POLYTECHNIQUE, Palaiseau (FR)

( * ) Notice: Subject to any disclaimer, the term of this patent is extended or adjusted under 35 U.S.C. 154(b) by 611 days.

(21) Appl. No.: 14/370,598

(22) PCT Filed: Jan. 3, 2013

(86) PCT No.: PCT/FR2013/050005
§ 371 (c)(1),
(2) Date: Jul. 3, 2014

(87) PCT Pub. No.: WO2013/102731
PCT Pub. Date: Jul. 11, 2013

(65) Prior Publication Data
US 2015/0000730 A1 Jan. 1, 2015

(30) Foreign Application Priority Data
Jan. 4, 2012 (FR) ..................... 12 50085

(51) Int. Cl.
*H01L 31/042* (2014.01)
*H01L 31/075* (2012.01)
(Continued)

(52) U.S. Cl.
CPC ............ *H01L 31/182* (2013.01); *B82Y 10/00* (2013.01); *H01L 21/0262* (2013.01);
(Continued)

(58) Field of Classification Search
None
See application file for complete search history.

(56) References Cited

U.S. PATENT DOCUMENTS

| 2010/0019252 A1* | 1/2010 | Bratkovski | H01L 33/18 257/80 |
| 2011/0042642 A1* | 2/2011 | Alet | B82Y 10/00 257/9 |
| 2011/0108109 A1* | 5/2011 | Kroll | H01L 31/076 136/258 |

FOREIGN PATENT DOCUMENTS

| EP | 1 936 666 A1 | 6/2008 |
| FR | 2 928 939 A1 | 9/2009 |

OTHER PUBLICATIONS

M. K. Sunkara, S. Sharma, and R. MirandaG. Lian and E. C. Dickey, "Bulk synthesis of silicon nanowires using a low-temperature vapor-liquid-solid method", Applied Physics Letters vol. 79, No. 10, Sep. 3, 2001.*

(Continued)

*Primary Examiner* — Seahvosh Nikmanesh
*Assistant Examiner* — Xiaoming Liu
(74) *Attorney, Agent, or Firm* — Young & Thompson (57) ABSTRACT

A method for the low-temperature production of radial electronic junction semiconductor nanostructures on a substrate, includes: a) forming on the substrate, metal aggregates capable of electronically doping a first semiconductor material; b) growing, in the vapor phase, doped semiconductor nanowires in the presence of one or more non-dopant precursor gases of the first semiconductor material, the substrate being heated to a temperature at which the metal (Continued)

aggregates are in the liquid phase, the growth of the doped semiconductor nanowires in the vapor phase being catalyzed by the metal aggregates; c) rendering the residual metal aggregates inactive; and d) the chemical vapor deposition, in the presence of one or more precursor gases and a dopant gas, of at least one thin film of a second semiconductor material so as to form at least one radial electronic junction nanostructure between the nanowire and the at least one doped thin film.

12 Claims, 5 Drawing Sheets (51) Int. Cl.
*B82Y 40/00* (2011.01)
*H01L 21/00* (2006.01)
*H01L 21/20* (2006.01)
*H01L 31/18* (2006.01)
*B82Y 10/00* (2011.01)
*H01L 21/02* (2006.01)
*H01L 31/0352* (2006.01)
*H01L 29/06* (2006.01)
*H01L 29/16* (2006.01)
*H01L 29/161* (2006.01)
*H01L 29/24* (2006.01)
*H01L 31/077* (2012.01)
*H01L 29/167* (2006.01)
*B82Y 30/00* (2011.01)

(52) U.S. Cl.
CPC .. *H01L 21/02422* (2013.01); *H01L 21/02472* (2013.01); *H01L 21/02532* (2013.01); *H01L 21/02576* (2013.01); *H01L 21/02579* (2013.01); *H01L 21/02603* (2013.01); *H01L 21/02645* (2013.01); *H01L 21/02653* (2013.01); *H01L 29/068* (2013.01); *H01L 29/0665* (2013.01); *H01L 29/0676* (2013.01); *H01L 29/16* (2013.01); *H01L 29/161* (2013.01); *H01L 29/167* (2013.01); *H01L 29/24* (2013.01); *H01L 31/035227* (2013.01); *H01L 31/035272* (2013.01); *H01L 31/035281* (2013.01); *H01L 31/075* (2013.01); *H01L 31/077* (2013.01); *H01L 31/18* (2013.01); *H01L 31/1804* (2013.01); *B82Y 30/00* (2013.01); *B82Y 40/00* (2013.01); *Y02E 10/547* (2013.01); *Y02E 10/548* (2013.01); *Y02P 70/521* (2015.11)

(56) References Cited

OTHER PUBLICATIONS

R. Rakesh Kumar, K. Narasimha Raoa, A.R. Phani, "Bismuth catalyzed growth of silicon nanowires by electron beam evaporation", Materials Letters 82 (2012) 163-166, May 30, 2012.*
Li Nwei Yu et al.: "Plasma-enhanced low temperature growth of silicon nanowires and hierarchical structures by using tin and indium catalysts" Nanotechnology. IOP. Bri Stol. GB. vol. 20. No. 22. Jun. 3, 2009 (Jun. 3, 2009), p. 225604. XP020160542, ISSN: 0957-4484 the whole document.
Yu L et al.: "All-in-situ fabrication and characterization of silicon nanowires on TCO/glass substrates for photovoltaic application", Solar Energy Materials and Solar Cells, Elsevier Science Publishers, Amsterdam. NL, vol. 94. No. 11. Nov. 1, 2010 (Nov. 1, 2010). pp. 1855-1859. XP027307642, ISSN: 0927-0248 [retrieved on Sep. 22, 2010] the whole document.
Linwei Yu et al.: "Synthesis. morphology and compositional evolution of silicon nanowires directly grown on SnO2 substrates", Nanotechnology. IOP. Bristol. GB, vol. 19. No. 48. Dec. 3, 2008 (Dec. 3, 2008). p. 485605. XP020144908, ISSN: 0957-4484. DOI: 10.1088/0957-4484/19/48/485605, the whole document.
Linwei Yu et al.: "Radial junction amorphous silicon solar cells on PECVD-grown silicon nanowires", Apr. 27, 2012 (Apr. 27, 2012), Nanotechnology. IOP. Bristol. GB. pp. 194011. XP020222443, ISSN: 0957-4484 the whole document.
International Search Report, dated Nov. 19, 2013, from corresponding PCT application.

* cited by examiner

METHOD FOR THE LOW-TEMPERATURE PRODUCTION OF RADIAL-JUNCTION SEMICONDUCTOR NANOSTRUCTURES, RADIAL JUNCTION DEVICE, AND SOLAR CELL INCLUDING RADIAL-JUNCTION NANOSTRUCTURES

The present invention generally relates to the fabrication of radial-junction electronic structures (for example of the n-i-p, p-i-n, n-p, p-n or tandem-cell type) formed from a network of semiconductor nanowires. The invention finds in particular applications in the fabrication of low-cost photovoltaic solar cells.

Solar energy is the most abundant renewable source of energy to support a sustainable development of human society. It is essential to promote the photovoltaic energy technologies to reduce the greenhouse gas emissions. However, it is also critical for the photovoltaic technologies to reach parity in terms of cost per watt relative to conventional electricity rates.

The first generation of solar cells, which was based on the use of crystalline silicon wafers, has dominated the photovoltaic market since its introduction, about fifty years ago. The band structure of crystalline silicon makes it not much effective in terms of light absorption, which requires a thickness of crystalline silicon of 100 to 300 micrometers. Moreover, the size of the solar cells is limited by the size of the crystalline silicon wafers. This leads to a high cost of materials for the solar cells based on crystalline silicon. For the purpose of reducing the cost per watt, the second generation of solar cells has adopted the polycrystalline silicon or amorphous silicon thin-film deposition technology. The thin-film solar cell technology is low cost and can be easily adapted to different support sizes (up to 6 m² on glass and on rolls of more than 1 km long). In a thin-film solar cell, a stack of differently-doped layers is deposited to produce a junction of the p-i-n or n-i-p type, for example, between two thin-film electrodes. The electrodes serve to collect the current of photogenerated carriers. The light absorption is all the more important since the thickness of amorphous or polycrystalline silicon is great. However, due to the small length of diffusion of the photogenerated carriers, the interelectrode distance has to be limited. A compromise has thus to be found in a thin-film planar solar cell between, on the one hand, a great thickness to ensure a sufficient level of light absorption in the material, and on the other hand, a long enough diffusion length with respect to the cell thickness to allow the collection of most of the photogenerated carriers. It is to be noted that more than the diffusion, it is the electric field generated by the doped layers that allows the separation of the electron-hole pairs. The performance of the thin-film solar cells is generally limited by the poor electric properties of the amorphous or monocrystalline silicon.

Other types of solar cell electronic junctions than the thin-film planar junctions have been developed. An electronic junction having a design of the p-i-n radial junction type has recently been proposed to overcome these limitations and drawbacks. This new radial junction design firstly consists in fabricating a network of nanowires serving as a physical support to a p-i-n electronic junction obtained by deposition of a p-doped semiconductor layer, then an intrinsic semiconductor layer (i), and finally of a n-doped semiconductor layer. A p-i-n radial junction with a 3D structure is thus realized above a network of nanowires. The forest of nanowires shows an omnidirectional light trapping and allows absorption over a wide range of wavelengths of the visible spectrum and the near infrared. A radial-junction structure allows to decouple the light absorption length from the distance of separation of the carriers.

The feasibility of the radial-junction solar cells has firstly been verified on a single silicon nanowire (Tian, Zheng et al 2007) or on a III-V semiconductor nanowire (Thunich, Prechtel et al. 2009). Radial-junction solar cells have also been made above a network of ordered or randomly vertical silicon nanowires (Tsakalakos, Balch et al. 2007; Yu, O'Donnell et al. 2010). The silicon nanowire networks that suit this application can be obtained, either by techniques of top-down etching in crystalline silicon (Garnett and Yang 2010; Lu and Lal 2010) or by a technique of bottom-up growth, for example the vapour-liquid-solid (VLS) technique (Schmid, Bjork et al. 2008; Yuan, Zhao et al. 2009; Schmidt, Wittemann et al. 2010).

The VLS approach consists in using drops of liquid-phase catalyst to catalyze the growth of nanowires from gaseous-phase precursors and to grow one-dimension solid structures such as nanowires. The VLS technique improves the nanowire fabrication method in various aspects. The VLS nanowire fabrication method is better controllable. The VLS method allows a scaling over great-size substrates, with a high efficiency. Finally, the VLS method is also compatible with a low growth temperature and applies to many low-cost substrates. However, the performances of a radial-junction solar cell made by the VLS technique on silicon nanowires are still rather limited, the efficiency being presently of the order of 0.1 to 2% (Tsakalakos, Balch et al. 2007; Th, Pietsch et al. 2008; Gunawan and Guha 2009; Perraud, Poncet et al. 2009). This limited efficiency bears witness to the fact that the transfer of knowledges established for the planar crystalline silicon or for the thin-film cells towards a 3D radial structure is not a trivial task. The optical design of a p-i-n radial junction has been until now made above a network of silicon nanowires. This new structure introduces fully new aspects in the design and the fabrication of high-performance solar cells with a 3D architecture. Today, radial-junction cells are made, whose efficiency reaches 5-6%.

The growth of silicon nanowires by a VLS method is most commonly based on the use of gold as a metal catalyst. However, the melting point of gold (Tm=1064° C.) requires a high temperature of substrate. Moreover, gold has for major drawback that it introduces electronic defects at deep levels in the middle of the silicon forbidden band. The contamination induced by gold as well as its very high cost explain that a step of recovery of the residual gold is implemented between the step of VLS growth and the step of deposition of a stack of thin layers. The growth of silicon nanowires by a VLS method has already been made, using as a metal catalyst indium, tin or gallium (Alet, Yu et al 2008; Yu Alet et al. 2008, Yu ODonnell et al 2009). The use of a metal catalyst such as tin, having a low melting point, allows the growth of silicon nanowires at temperatures lower than 200° C. (Yu, Alet et al. 2008; Yu, O'Donnell et al. 2009). Moreover, tin does not introduce electronic defects at the middle of the silicon forbidden band, as it is the case for Au.

On the other hand, the doping of an electronic junction (p-n, n-p, p-i-n or n-i-p) made by chemical vapour deposition is generally based on the use of several dopant gases during the chemical vapour deposition process. The fabrication of an electronic junction commonly requires the use of at least two dopant gases, a first dopant gas for the n-type doping and another dopant gas for the p-type doping. Now, the use of several dopant gases introduces complicated problems for the cleaning of the deposition chamber so as to avoid cross-contaminations between the different layers deposited. The dopant gases indeed cover the inner walls of the deposition chamber and are recycled during the following step of deposition of a differently doped layer. In the case of a p-i-n or n-i-p junction, it is very difficult to avoid a contamination of the intrinsic layer with the p or n dopant of the layer underlying the intrinsic layer deposited in the same deposition reactor. On the other hand, the dopant gases, such as $B_2H_6$ or $PH_3$ are toxic gases.

One of the objects of the invention is to simplify the method of fabrication of a solar cell. Another object of the invention is to reduce the contamination of the intrinsic layer of a p-i-n or n-i-p junction with the dopants used in the reactor or with the dopant of an underlying layer. In particular, it is essential to avoid the creation of centers of electronic trapping at the center of the forbidden band of the semiconductor material. It is also crucial to avoid the cross-contamination for the n- and p-doped layers of an electronic junction. Another object of the invention is to limit the use of toxic dopant gases such as $B_2H_6$ or $PH_3$.

The present invention has for object to remedy the drawbacks of the prior art and more particularly relates to a method for the low-temperature production of at least one radial-electronic-junction semiconductor nanostructure on a substrate, comprising the following steps:
a) formation of metal aggregates on said substrate, said metal aggregates being capable of electronically doping a first semiconductor material with a first doping type,
b) vapour-phase growth of doped semiconductor nanowires in said first semiconductor material on said substrate covered with metal aggregates, said substrate being heated to a temperature higher than or equal to the eutectic temperature of said metal aggregates, the vapour-phase growth of doped semiconductor nanowires being catalyzed by said metal aggregates in the presence of one or several precursor gases of said first semiconductor material, said one or several precursor gases being non-dopant gases,
c) inactivation of the residual metal aggregates,
d) chemical vapour deposition in the presence of one or several precursor gases and one dopant gas of at least one thin layer of a second semiconductor material on said doped semiconductor nanowires, said dopant gas being capable of electronically doping said second semiconductor material with a second doping type, and said at least one thin layer of a second semiconductor material being conformally deposited on said doped semiconductor nanowires to form at least one radial-electronic-junction nanostructure between said semiconductor nanowires doped with a first doping type and said at least one thin layer doped with a second doping type,
said steps of a) formation of metal aggregates, b) growth of doped semiconductor nanowires, c) inactivation of metal aggregates and d) chemical vapour deposition being performed successively in a same vacuum deposition chamber.

According to a preferred embodiment, the method for production of at least one radial-electronic-junction semiconductor nanostructure comprises an intermediate step between step c) of inactivation of the residual metal aggregates and step d) of chemical vapour deposition of at least one thin layer of a second doped semiconductor material, said intermediate step comprising a step of chemical vapour deposition in the presence of one or several precursor gases of another thin layer of a third non-doped (or intrinsic) semiconductor material, conformally on said doped semiconductor nanowires, said doped semiconductor nanowires being p-doped and said at least one thin layer of a second semiconductor material being n-doped to form p-i-n radial-electronic-junction semiconductor nanostructures, or respectively said doped semiconductor nanowires being n-doped and said at least one thin layer of a second semiconductor material being p-doped to form n-i-p radial-electronic-junction semiconductor nanostructures.

According to various particular aspects of the method of the invention:
step c) of inactivation of the residual metal aggregates comprises a step of reduction of the temperature down to a temperature lower than the eutectic temperature of said metal aggregates and/or a step of chemical vapour etching and/or a step of application of a hydrogen-reducing plasma;
step d) of chemical deposition of at least one thin layer of a second doped semiconductor material comprises a step of chemical vapour deposition or a step of plasma-enhanced chemical vapour deposition, in the presence of a gas mixture comprising a precursor gas of the second semiconductor material and a dopant gas;
said first semiconductor material, said second semiconductor material and/or said third semiconductor material are chosen among silicon and germanium;
said first semiconductor material is p-doped crystalline silicon and said second semiconductor material is n-doped amorphous silicon, and/or said third semiconductor material is intrinsic amorphous silicon;
step a) of formation of metal aggregates comprises the formation of aggregates consisted of bismuth, gallium or an alloy of tin and a material chosen among bismuth, indium and gallium, bismuth and the bismuth and tin alloy being capable of producing a n-type electronic doping in silicon, gallium and the tin and gallium or indium alloy being capable of producing a p-type electronic doping in silicon.

According to a particular embodiment, said thin layer of a third intrinsic semiconductor material includes amorphous silicon, and said method includes an additional step after step c) of inactivation of the residual metal aggregates and before the step of deposition of said thin layer of intrinsic amorphous silicon, said additional step comprising a step of chemical vapour deposition in the presence of one or several precursor gases of an amorphous thin layer of a semiconductor material having the same doping type as the doped semiconductor nanowires, conformally on said doped semiconductor nanowires.

According to other particular aspects of the method of the invention:
the temperature of the substrate during steps a) b) c) and d) remains lower than 400° C.;
the substrate is made of a non-textured metal substrate, crystalline or polycrystalline silicon, glass, polymer or plastic material.

According to a particular embodiment, the method of the invention comprises at least one following additional step after step d):
e) deposition of at least one other stack of a plurality of thin layers of semiconductor material, said at least one other stack of thin layers being deposited conformally on said at least one radial-electronic-junction semiconductor nanostructure and said plurality of thin layers having a respective doping adapted to form at least one double-radial-electronic-junction semiconductor nanostructure (tandem cell).

The invention also relates to a radial-electronic-junction device comprising a substrate, at least one doped semiconductor nanowire made of a first semiconductor material doped with a first doping type, said at least one doped semiconductor nanowire extending from said substrate, at least one thin layer of a second semiconductor material with a second doping type, said at least one thin layer of a second semiconductor material being deposited conformally on said at least one doped semiconductor nanowire to form at least one radial-electronic-junction semiconductor nanostructure between said doped semiconductor nanowire and said at least one thin layer of a second doped semiconductor material.

According to a particular embodiment, the radial-electronic-junction device further includes another thin layer of a third intrinsic semiconductor material deposited conformally on said at least one doped semiconductor nanowire and under said at least one thin layer of a second semiconductor material, said at least one doped semiconductor nanowire being p-doped and said at least one thin layer of a second semiconductor material being n-doped to form at least one p-i-n radial-electronic-junction semiconductor nanostructure, or respectively said at least one doped semiconductor nanowire being n-doped and said at least one thin layer of a second semiconductor material being p-doped to form at least one n-i-p radial-electronic-junction semiconductor nanostructure.

According to a particular embodiment, the radial-electronic-junction device further includes at least one other stack of a plurality of semiconductor thin layers, said at least one other stack of thin layers being deposited conformally on said at least one radial-electronic-junction semiconductor nanostructure and said plurality of semiconductor thin layers having a respective doping adapted to form at least one double-radial-electronic-junction semiconductor nanostructure (in other words, a tandem cell).

According to a particular embodiment, the radial-electronic-junction device comprises at least one silicon doped nanowire.

The invention also relates to a solar cell comprising a plurality of radial-electronic-junction nanostructures according to one of the embodiments of the invention.

The invention will find a particularly advantageous application in the low-cost fabrication of high-efficiency solar cells.

The present invention also relates to the characteristics that will be revealed during the following description and that will have to be considered in isolation or according to any technically possible combination thereof.

The invention will be better understood and other objects, details, characteristics and advantages thereof will appear more clearly when reading the description of one (several) particular embodiment(s) of the invention given only by way of illustrative and non-limitative example, in reference to the appended drawings. In these drawings.

We use a VLS-type fabrication method to produce in a simplified manner radial-electronic-junction nanostructures.

More precisely, the growth of silicon nanowires by metal catalysis allows solving the problem of contamination of an intrinsic semiconductor material layer by the dopant gas of the underlying doped layer, as explained hereinafter.

We have developed a special technique for incorporating the silicon nanowire structure in a thin-film solar cell structure in a conventional PECVD plasma deposition system. The use of a catalyst such as indium and tin with a low melting point allows the growth of silicon nanowires at temperatures lower than 200° C., while avoiding the contamination at deep levels in the middle of the forbidden band that are created by a catalyst such as gold. The invention uses the step of metal catalysis growth to dope by catalysis, in situ, n-type or p-type semiconductor nanowires without using a dopant gas.

We use different metal catalysts to perform the doping of the core of the semiconductor nanowires, for example of silicon nanowires. For example, bismuth is used to introduce a low deep n-type doping in silicon nanowires. Gallium or indium produce a p-type doping in silicon nanowires. The incorporation of dopant during the growth of the semiconductor nanowires may be made in situ during a VLS-type method of nanowire growth in a conventional device of plasma-enhanced chemical deposition (PECVD).

In order to avoid the diffusion of dopants in a radial structure of the p-n or p-i-n type, the deposition temperature is precisely controlled so as to be the lowest possible. The reduction of the deposition temperature is an important point for the incorporation of semiconductor nanowires in low-cost thin-film structure deposition methods. We select bismuth or the alloy thereof with tin to reduce the growth temperature of the semiconductor nanowires.

Figure 1A:
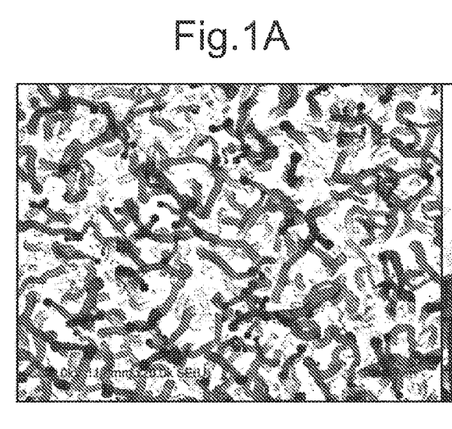
FIG. 1A shows a microphotography of silicon nanowires obtained by VLS growth from a pure liquid bismuth catalyst.
Figure 1B:
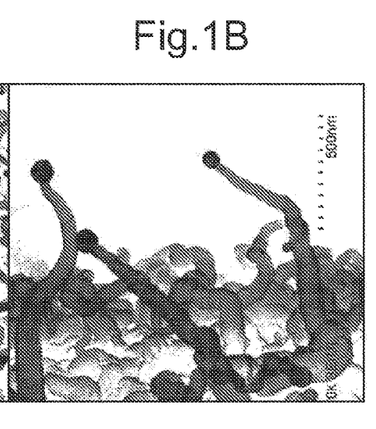
FIG. 1B shows an enlargement of a nanowire of FIG. 1A.

According to a preferred embodiment of the invention, we use bismuth or an alloy of bismuth as a metal catalyst to produce silicon nanowires at low temperature and to control the doping by incorporation of the metal catalyst in the silicon nanowires. Bismuth introduces a n-type doping at a shallow level, at 160 mV below the silicon conduction band. FIGS. 1A and 1B show silicon nanowires produced from droplets of (pure) bismuth in a VLS method at 350° C. FIG. 1B shows an enlargement of a silicon nanowire of FIG. 1A. As can be observed in FIGS. 1A and 1B, the silicon nanowires obtained from a pure bismuth catalyst show relatively random curvatures and orientations. The catalyst can hence also be used to control the morphology of the silicon nanowires.

The nanowires have a length that can be comprised between a few tens of nanometers and several hundreds of nanometers, or even several micrometers.

Figure 2:
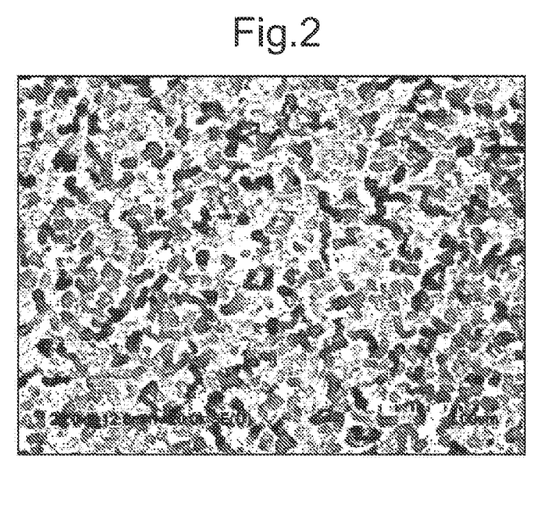
FIG. 2 shows a microphotography of silicon nanowires obtained by VLS growth from a catalyst formed of an alloy of bismuth and tin.
Figure 3:
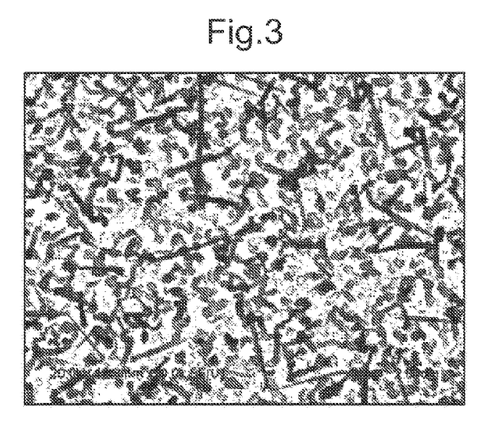
FIG. 3 shows a microphotography of silicon nanowires obtained by VLS growth from a catalyst formed of pure tin.

FIGS. 2 and 3 show silicon nanowires obtained by a VLS method at a temperature of 500° C. The metal catalyst used is an alloy of bismuth and tin in the case of FIG. 2 and pure tin in the case of FIG. 3. The addition of tin to form an alloy of bismuth and tin leads to a more rectilinear morphology of nanowires, as can be observed in FIG. 3, and at a faster speed of growth of the nanowires at a same temperature. The pure tin does not introduce doping of the silicon.

Figure 4:
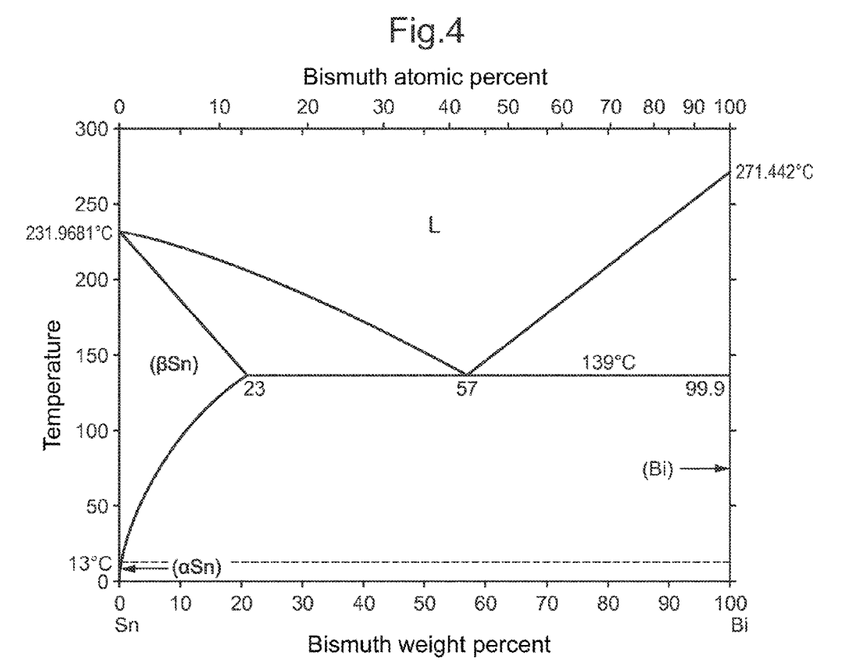
FIG. 4 shows the phase diagram of an alloy of bismuth and tin as a function of the relative proportion of the two elements and as a function of the temperature.

We propose to control precisely the growth temperature of the silicon nanowires using an alloy of bismuth for the n-type doping of the silicon nanowires or an alloy of gallium for the n-type doping of the silicon nanowires. More precisely, the melting temperature of an alloy of bismuth (or gallium) and tin can be significantly reduced. FIG. 4 shows the phase diagram of an alloy of bismuth and tin as a function of the relative proportion of the two elements. The liquidus curve delimits the range (denoted L) over which the Bi—Sn alloy is fully liquid. The solidus curve delimits the range over which the Bi—Sn alloy is fully solid. Between the solidus curve and the liquidus curve, the alloy is in part liquid and in part solid. Over a large range of composition of a Bi—Sn alloy, for a proportion of Bi comprised between 0% and 43%, the melting temperature of the alloy remains lower than 232° C. For a relative concentration of 43% of Bi, the eutectic point is lowered to only 139° C. This allows reducing very significantly the growth temperature of the silicon nanowires and offers very interesting prospects for the development of the silicon nanowire applications.

We also propose a method for efficiently controlling the concentration of dopant incorporated during the silicon nanowire growth, using an alloy of bismuth (for the n-type doping) or gallium (for the p-type doping). Indeed, tin does not introduce doping in silicon nanowires. Combined to the other growth parameters (in particular, the temperature), the control of the bismuth, or respectively gallium, concentration in an alloy with tin is an efficient manner to control the incorporation of Bi or Ga dopant in silicon nanowires. This approach also allows controlling the morphology of the silicon nanowires.

Based on silicon nanowires by a VLS method using a metal catalyst comprising bismuth, we have made a solar cell with a radial-electronic-junction structure.

Figure 5:
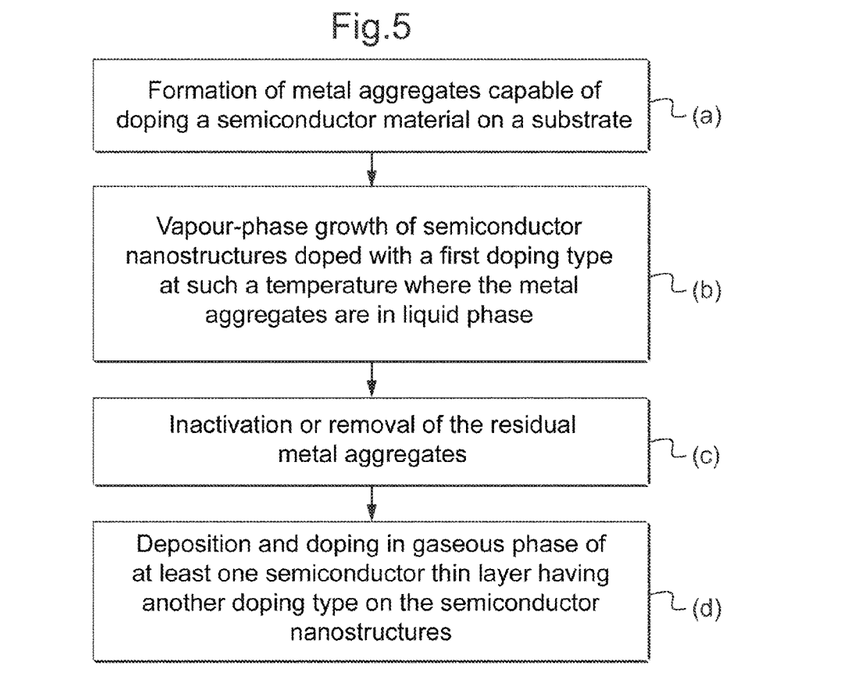
FIG. 5 schematically shows the steps of production of radial-electronic-junction nanostructures according to an embodiment of the invention.

FIG. 5 schematically shows the steps of a method of fabrication of radial-electronic-junction nanostructures according to an embodiment of the invention.

According to one embodiment, silicon nanowires are grown from nanodrops of a metal catalyst based on pure bismuth—steps a) and b). A pre-processing of the substrate (consisted of a plate of glass covered with a layer of ~1 μm of Al-doped ZnO and of a thin layer of bismuth) by a hydrogen plasma allows cleaning the oxidized surface of the Bi during the transfer of the substrate in the PECVD reactor. A hydrogen plasma applied on the Bi allows removing a layer of residual oxide at the surface, which would made bismuth inactive. The hydrogen plasma also allows transforming the layer of bismuth or of metal alloy into nanodrops. The nanowire growth is performed in the presence of the nanodrops of metal catalyst and of precursor gas, the substrate being at a temperature at which the catalyst is in liquid state. In the case where the catalyst is pure bismuth, the growth temperature is for example of 275° C. (higher than the melting point of pure bismuth at 271.33° C., cf. FIG. 4). In the case where the catalyst is an alloy, the substrate is heated to a temperature higher than or equal to the temperature of liquefaction of the alloy, i.e. a temperature located above the liquidus curve on the phase diagram of the alloy considered. A substrate covered with n-doped silicon nanowires is thus obtained. The silicon nanowires have a length of about 0.5 to 10 micrometers. Then, the temperature of the substrate is reduced to a value lower than the temperature of solidification of the catalyst, for example of 180° C., where pure bismuth is solid and inactive as a catalyst (step c of the method of FIG. 5). In the case where the catalyst is an alloy, the temperature is then reduced to pass below the solidus curve in the phase diagram of the alloy considered. At this temperature of 180° C. and in the same deposition chamber, a deposition of a thin layer of intrinsic amorphous silicon is performed to cover conformally the silicon nanowires (step e), not shown in FIG. 5. For example, an intrinsic silicon layer is deposited by plasma deposition in the presence of a mixture of a precursor gas (silane) and of hydrogen, to form a layer of undoped hydrogenated amorphous silicon. It is important that the thickness of the intrinsic silicon layer is uniform to optimize the current-voltage performances of the radial-junction structure. Finally, the deposition of a thin layer of p+ doped hydrogenated amorphous silicon is performed, still in the same deposition chamber, from a mixture of a precursor gas (silane, for example) and a p-type dopant gas (for example, trimethylbore or TMB, less toxic than $B_2H_6$) (step d of the method of FIG. 5). A nanostructure with a complete radial junction of the p-i-n type is thus obtained. It is observed that a single dopant gas is used to realize this radial-junction nanostructure, the doping of the core of the nanowires coming only from the metal catalyst. The use of a single doping gas allows selecting a dopant gas such as TMB, which is classified as a far less dangerous gas than the dopant gases such as diborane or phosphine ($PH_3$), which allows an increased security of the method of fabrication.

Advantageously, the silicon nanowires that are n-doped at the core of the radial junction are made of crystalline silicon. It is easy to obtain a growth of nanowires based on microcrystalline silicon at a temperature lower than 200° C. and to continue the growth with a p-doped microcrystalline layer (forming a nip radial junction in which the absorber is microcrystalline silicon).

According to a particular embodiment, in the case where the intrinsic layer is based on amorphous silicon, the method includes an additional step of formation of an amorphous layer, referred to as the buffer layer, deposited on the nanowire before the deposition of the intrinsic silicon layer, the buffer layer having the same doping type as the nanowire. This buffer layer with a great gap and the same doping type as the crystalline nanowire allows to reduce the recombination of electron-hole pairs at the interface between the nanowire and the intrinsic layer, and thus to increase the cell efficiency.

According to another particular aspect, it is possible to complete with the deposition in the same reactor of an n-doped amorphous layer, an amorphous i layer and an amorphous p layer, thus obtaining a NIP/NIP tandem cell.

Another way to make the catalyst inactive after the completion of the n-doped silicon nanowire growth is to etch the remaining catalyst by applying a hydrogen plasma in the same reactor as that where is performed the growth of the silicon nanowires and the deposition of thin layers forming the radial junction. In this case, the duration of application of the etching plasma is limited so as to avoid reducing the size of the nanowires or fully etching them. In another embodiment, the catalyst can have been fully consumed at the end of the step of nanowire growth, in which case it is not necessary to inactivate the catalyst before passing to the step of conformal deposition of thin layer on the doped semiconductor nanowires.

The method of fabrication of the invention is fully implemented in a single deposition chamber, at a temperature comprised between 200° C. and 400° C.

The advantage of the metal catalyst used, based on bismuth or an alloy of tin and bismuth, is that it is possible to make it inactive or to remove it in the same reactor of nanowire growth and of thin layer deposition. It is not necessary to open the vacuum deposition chamber, neither to remove the sample nor to transfer it to another chamber to remove the catalyst at the end of the nanowire growth. By way of comparison, in the VLS methods where gold is used as a catalyst, it is necessary to remove all the remaining gold at the end of the nanowire growth to avoid a contamination of the intrinsic layer.

Figure 6:
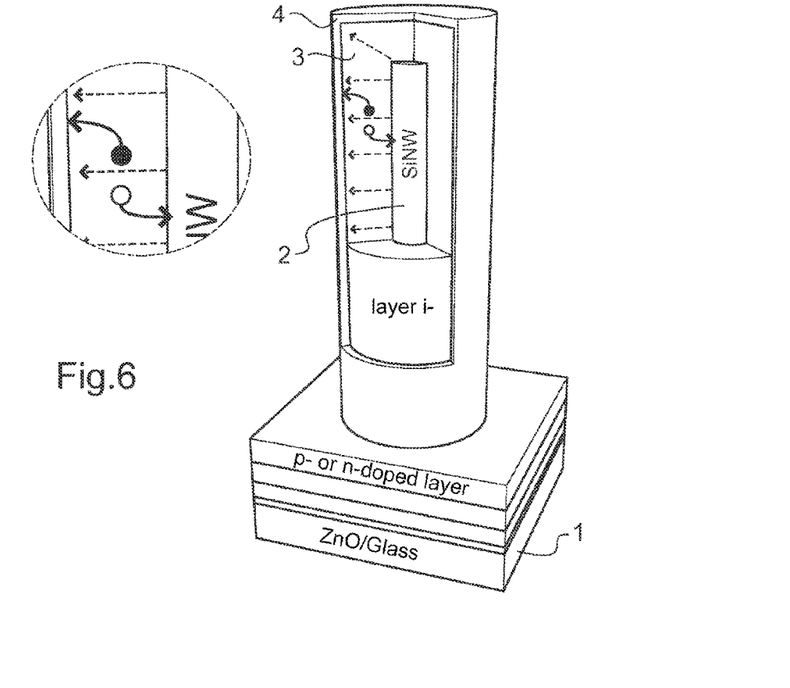
FIG. 6 schematically shows an exploded view of a radial-electronic-junction nanostructure according to an embodiment of the invention.

FIG. 6 schematically shows a radial-junction nanostructure obtained according to the preferred embodiment of the invention. The substrate 1 is for example a low-cost substrate, such as a glass substrate covered with a ZnO layer. The core of the nanowire 2 is n-doped; the nanowire 2 is conformally covered with a thin layer 3 of intrinsic silicon, then with a thin layer 4 of p-doped silicon. The thin layer 3 of intrinsic silicon is used for the absorption of sun light, for example. The n-doped nanowire 2 and the p-doped thin layer that form the radial junction are very close to each other and produce an increased separation of the carriers, thanks to the high inner electric field.

Figure 7A:
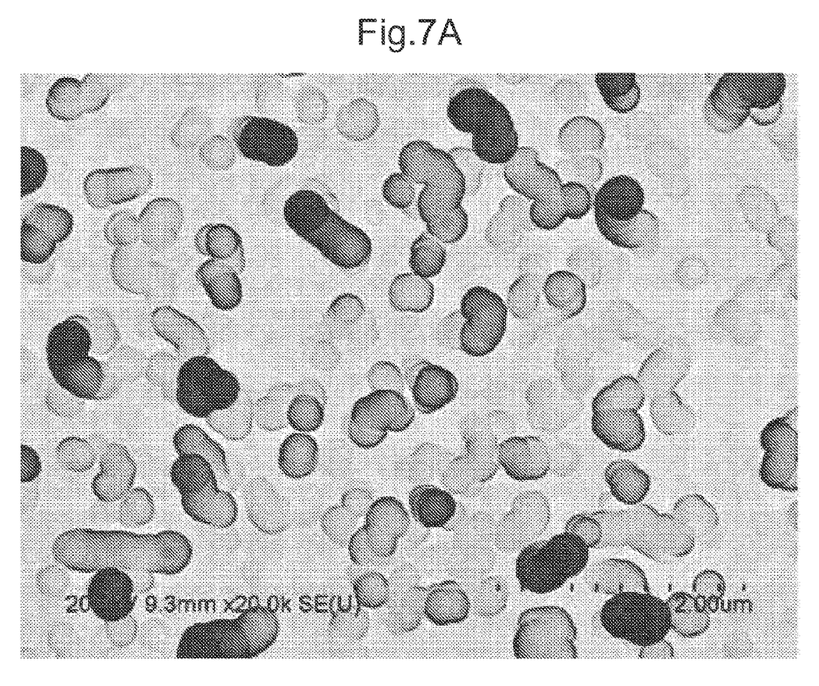
FIG. 7A shows a microphotography of radial-electronic-junction nanostructure formed from silicon nanowires obtained by the method of production of the invention.
Figure 7B:
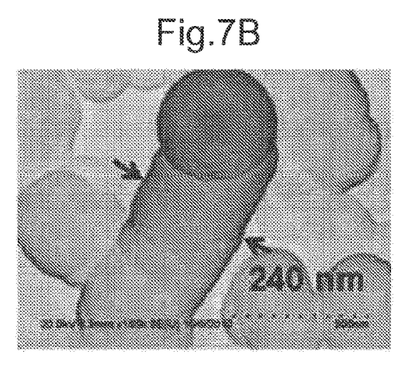
FIG. 7B shows an enlargement of a radial-electronic-junction nanostructure of FIG. 7A.
Figure 7C:
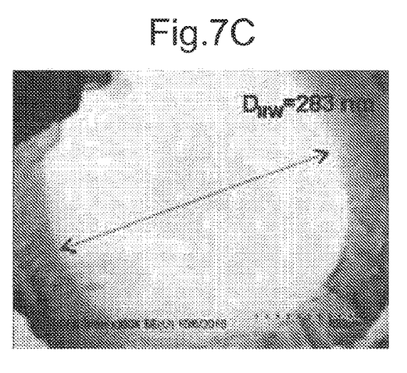
FIG. 7C shows a sectional view of a radial-electronic-junction nanostructure of FIG. 7A.

FIGS. 7A, 7B and 7C show microscope views of radial-junction nanostructures obtained according to an embodiment of the invention. The radial-junction nanostructures form a forest of elementary radial junctions, which improve the trapping of light. The total thickness of the radial-junction structure remains however lower than 200 nm. For radial-junction nanostructures according to the invention, having a thickness of 20 nm and having a current density of 11-13 mA/cm$^2$, the duration of fabrication is reduced to about 20 minutes. By way of comparison, the duration of fabrication of microcrystalline solar cells having a thickness of the order of 2 micrometers is about 2 hours. The cost of fabrication of radial-junction structures with silicon nanowires is thus far lower than that of a planar junction of polycrystalline silicon.

Figure 8:
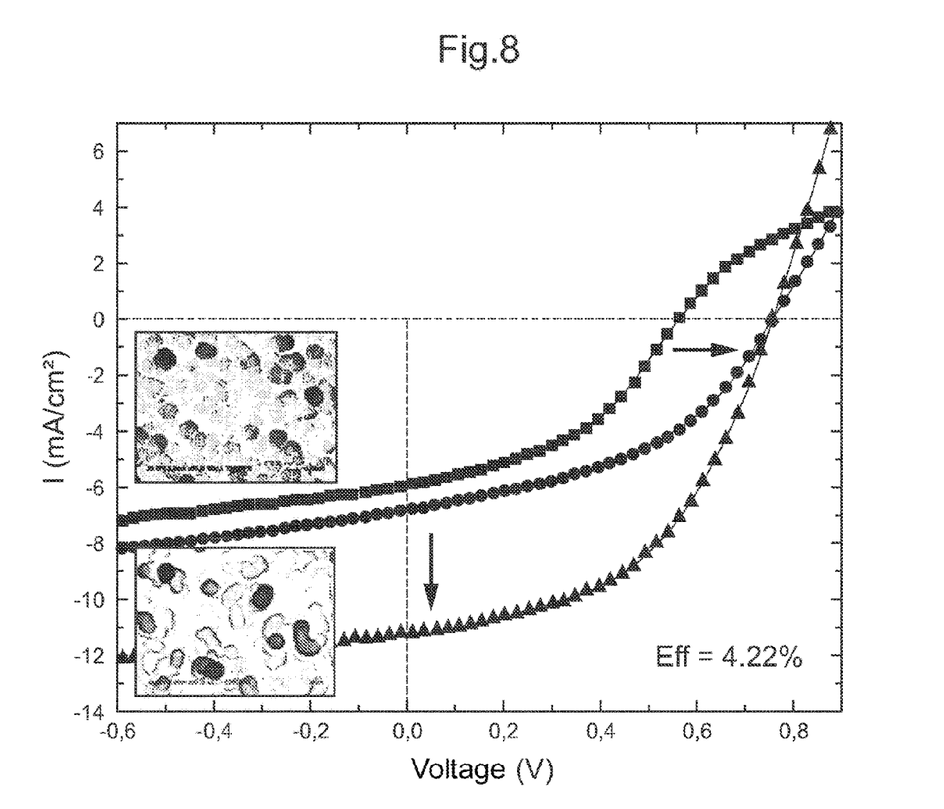
FIG. 8 shows current-voltage (or I-V) curves of different electronic-junction nanostructure.

FIG. 8 shows current-voltage (or I-V) curves of different electronic junctions and in particular of radial-junction nanostructures obtained according to two embodiments of the invention. The curve represented by squares corresponds to a reference sample, i.e. a p-i-n junction of the planar type with no bismuth-doped silicon nanowires. The curve represented by circles correspond to a sample of p-i-n radial junction nanostructures from bismuth-doped silicon nanowires, in which the nanowires have a length of about 0.5 µm. The curve represented by triangles corresponds to a sample of p-i-n radial junction nanostructures from bismuth-doped silicon nanowires, in which the nanowires have a length of about 1 µm. It is observed in the I-V curves of FIG. 8 that the use of bismuth as a dopant-catalyst and thus of doped silicon nanowires increases the voltage value Voc from 0.54 V to 0.72 V. Moreover, it is clearly observed an increase of the short-circuit current, using long nanowires rather than short nanowires. The long nanowires allow a better light-trapping effect, the electric current increasing from 6 mA/cm$^2$ to 8 mA/cm$^2$ for the short nanowires (linked to a limited light trapping) and to 12 mA/cm$^2$ for the long nanowires (linked to a strong light trapping). This confirms the feasibility of the fabrication of radial-junction-structure solar cells from silicon nanowires, using bismuth as a catalyst. The I-V curves also confirm, by their Voc, the effective n-type doping induced by the metal catalyst in the silicon nanowires, this effective doping producing an increase of the voltage Voc in the absence of any n-type dopant gas in the deposition reactor.

One of the objects of the invention is to make a solar cell having an efficiency of 10-12% for a simple junction and of 14% for a tandem junction. The optimal texture obtained with the doped silicon nanowires allows avoiding the use of a method for texturing the surface of a glass or ZnO substrate, which implies an additional cost.

The method of fabrication of radial-junction nanostructures being performed at low temperature. Advantageously, the temperature of the substrate remains lower than a temperature of 350-400° compatible with the PECVD thin-film deposition. In the case where the catalyst is bismuth, the temperature can remain lower than about 275° C. According to a preferred embodiment, we use an alloy of tin and bismuth (with for example ~10% of Bi) to make n-doped nanowires, or an alloy of tin and gallium (with for example 10% of Ga) to make p-doped nanowires. The method applies to many low-cost substrates, such as a substrate made of glass, of low-cost metal, of polymer or of plastic sheet. Moreover, the invention applies to different sizes of substrate and is compatible with the current lines of production of solar cells based on amorphous silicon and microcrystalline silicon.

The radial-junction structure of the invention has almost no Staebler-Wronski effect. Due to the fact that the thickness of the layers of the radial junction is low, the Staebler-Wronski effect is limited to a saturation value of about 4% instead of 20% in a thin-film structure of amorphous silicon.

The method of the invention could be a key step to allow the fabrication of high-efficiency electronic junctions of radial structure. Moreover, the method of the invention is simplified compared with the prior art, because it requires only one dopant gas.

The use of metal catalysts such as bismuth or an alloy of bismuth and tin to catalyze the growth of silicon nanowires does not constitute an electronic poison for the semiconductor material. On the contrary, gold, which is generally used as a catalyst in the growth of silicon nanowires, must be fully removed in specific process chamber to avoid any contamination of the silicon. Another advantage of the metal catalysts used is their low cost compared with the cost of gold.

The invention advantageously allows fabricating a radial junction of photovoltaic nanowires in a configuration of thin-film solar cells with a p-n or p-i-n junction. The fabrication and the doping of nanowires may be performed in a single step by a catalysis process.

The metal catalyst has advantageously a melting point at a low temperature lower than 275° C. in the case of Bi. The invention allows the use of only one dopant gas in a single thin-film deposition chamber, which allows to simplify the method of fabrication. The method of fabrication is also faster, which allows reducing the cost of the whole method of fabrication. The invention allows the fabrication of radial-junction structures having a high efficiency for a low thickness of deposition. The invention applies in particular to the method of fabrication of solar cells.

The invention claimed is:

1. A method for the low-temperature production of at least one radial-electronic-junction semiconductor nanostructure on a substrate (1), said method comprising the following steps:
   a) formation of metal aggregates on said substrate (2), said metal aggregates being capable of electronically doping a first semiconductor material with a first doping type, b) vapour-phase growth of doped semiconductor nanowires (2) in said first semiconductor material on said substrate (2) covered with metal aggregates, said substrate (1) being heated to a temperature higher than or equal to the eutectic temperature of said metal aggregates, the vapour-phase growth of doped semiconductor nanowires (2) being catalyzed by said metal aggregates in the presence of one or several precursor gases of said first semiconductor material, said one or several precursor gases being non-dopant gases, c) inactivation of the residual metal aggregates, d) chemical vapour deposition in the presence of one or several precursor gases and one dopant gas of at least one thin layer (4) of a second semiconductor material on said doped semiconductor nanowires (2), said dopant gas being capable of electronically doping said second semiconductor material with a second doping type, and said at least one thin layer (4) of a second semiconductor material being conformally deposited on said doped semiconductor nanowires (1) to form at least one radial-electronic-junction nanostructure between said semiconductor nanowires (2) doped with a first doping type and said at least one thin layer (4) doped with a second doping type, said steps of a) formation of metal aggregates, b) growth of doped semiconductor nanowires, c) inactivation of metal aggregates and d) chemical vapour deposition being performed successively in a same vacuum deposition chamber.

2. The method for the production of a least one radial-electronic-junction semiconductor nanostructure according to claim 1, comprising an intermediate step between step c) of inactivation of the residual metal aggregates and step d) of chemical vapour deposition of at least one thin layer of a second doped semiconductor material, said intermediate step comprising a step of chemical vapour deposition in the presence of one or several precursor gases of another thin layer (3) of a third intrinsic semiconductor material, conformally on said doped semiconductor nanowires (2), said doped semiconductor nanowires (2) being p-doped and said at least one thin layer (4) of a second semiconductor material being n-doped to form p-i-n radial-electronic-junction semiconductor nanostructures, or respectively said doped semiconductor nanowires (2) being n-doped and said at least one thin layer (4) of a second semiconductor material being p-doped to form n-i-p radial-electronic-junction semiconductor nanostructures.

3. The method for the production of a least one radial-electronic-junction semiconductor nanostructure according to claim 1, wherein step c) of inactivation of the residual metal aggregates comprises a step of reduction of the temperature down to a temperature lower than the eutectic temperature of said metal aggregates and/or a step of chemical vapour etching and/or a step of application of a hydrogen-reducing plasma.

4. The method for the production of a least one radial-electronic-junction semiconductor nanostructure according to claim 1, wherein step d) of chemical deposition of at least one thin layer (4) of a second doped semiconductor material comprises a step of chemical vapour deposition or a step of plasma-enhanced chemical vapour deposition, in the presence of a gas mixture comprising a precursor gas of the second semiconductor material and a dopant gas.

5. The method for the production of a least one radial-electronic-junction semiconductor nanostructure according to claim 1, wherein said first semiconductor material, said second semiconductor material and/or said third semiconductor material are chosen among silicon and germanium.

6. The method for the production of a least one radial-electronic-junction semiconductor nanostructure according to claim 5, wherein said first semiconductor material is p-doped crystalline silicon and said second semiconductor material is n-doped amorphous silicon, and/or said third semiconductor material is intrinsic amorphous silicon.

7. The method for the production of a least one radial-electronic-junction semiconductor nanostructure according to claim 1, wherein step a) of formation of metal aggregates comprises the formation of aggregates consisted of bismuth, gallium or an alloy of tin and a material chosen among bismuth, indium and gallium, bismuth and the bismuth and tin alloy being capable of producing a n-type electronic doping in silicon, gallium and the tin and gallium or indium alloy being capable of producing a p-type electronic doping in silicon.

8. The method for the production of a least one radial-electronic-junction semiconductor nanostructure according to claim 2, wherein said thin layer (3) of a third intrinsic semiconductor material includes amorphous silicon, and in that said method includes an additional step after step c) of inactivation of the residual metal aggregates and before the step of deposition of said thin layer (3) of intrinsic amorphous silicon, said additional step comprising a step of chemical vapour deposition in the presence of one or several precursor gases of an amorphous thin layer of a semiconductor material having the same doping type as the doped semiconductor nanowires (2), conformally on said doped semiconductor nanowires (2).

9. The method for the production of a least one radial-electronic-junction semiconductor nanostructure according to claim 1, comprising at least one following additional step after step d):

e) deposition of at least one other stack of a plurality of thin layers of semiconductor material, said at least one other stack of thin layers being deposited conformally on said at least one radial-electronic-junction semiconductor nanostructure and said plurality of thin layers having a respective doping adapted to form at least one double-radial-electronic-junction semiconductor nanostructure.

10. The method for the production of a least one radial-electronic-junction semiconductor nanostructure according to claim 1, wherein the temperature of the substrate during steps a) b) c) and d) remains lower than 400° C.

11. The method for the production of a least one radial-electronic-junction semiconductor nanostructure according to claim 1, wherein the substrate is a non-textured metal substrate, crystalline or polycrystalline silicon, glass, polymer or plastic material.

12. The method for the production of a least one radial-electronic-junction semiconductor nanostructure according to claim 2, wherein step c) of inactivation of the residual metal aggregates comprises a step of reduction of the temperature down to a temperature lower than the eutectic temperature of said metal aggregates and/or a step of chemical vapour etching and/or a step of application of a hydrogen-reducing plasma.

* * * * *